United States Patent [19]

Ostrander

[11] Patent Number: 5,123,972
[45] Date of Patent: Jun. 23, 1992

[54] HARDENED INSERT AND BRAKE SHOE FOR BACKSTOPPING CLUTCH

[75] Inventor: Robert J. Ostrander, Sterling Heights, Mich.

[73] Assignee: Dana Corporation, Toledo, Ohio

[21] Appl. No.: 680,759

[22] Filed: Apr. 9, 1991

Related U.S. Application Data

[63] Continuation-in-part of Ser. No. 517,563, Apr. 30, 1990.

[51] Int. Cl.[5] ............................................. C21D 9/00
[52] U.S. Cl. ........................... 188/251 A; 188/250 R; 188/251 A; 188/262; 427/419.7; 428/660; 428/926; 428/932; 428/938; 148/529; 148/537
[58] Field of Search ..................... 148/11.5 R; 428/660, 428/926, 932, 938; 427/419.7; 192/12 R; 188/251 A, 250 R, 262

[56] References Cited

U.S. PATENT DOCUMENTS

| | | | |
|---|---|---|---|
| 1,923,814 | 8/1931 | Egan | 148/16.6 |
| 1,940,333 | 10/1931 | Squires | 416/232 |
| 2,142,139 | 1/1939 | Machlet | 148/16.7 |
| 2,784,639 | 3/1957 | Keenan et al. | 148/16.6 |
| 2,946,708 | 7/1960 | Berghaus et al. | 148/16.6 |
| 3,194,694 | 7/1965 | Satoh | 148/15.5 |
| 3,264,135 | 8/1966 | Wakelyn et al. | 428/213 |
| 3,282,746 | 11/1966 | Zlotek et al. | 428/622 |
| 3,416,976 | 12/1968 | Brill-Edwards | 148/12.4 |
| 3,497,044 | 2/1970 | Kalns | 192/8 R |
| 3,656,995 | 4/1972 | Reedy, Jr. | 148/16.6 |
| 3,677,832 | 7/1972 | Van Thyne et al. | 148/317 |
| 3,713,906 | 1/1973 | Van Thyne et al. | 148/317 |
| 3,765,954 | 10/1973 | Tokuda et al. | 148/20.3 |
| 3,959,557 | 5/1976 | Berry | 428/368 |
| 4,162,338 | 7/1979 | Schintlmeister | 428/249 |
| 4,337,300 | 6/1982 | Itaba et al. | 428/938 |
| 4,351,861 | 9/1982 | Henery | 427/255.1 |
| 4,359,493 | 11/1982 | Henery | 427/255.1 |
| 4,447,263 | 5/1984 | Sugizawa et al. | 427/255.1 |
| 4,481,264 | 11/1984 | Faure | 148/16.6 |
| 4,511,411 | 4/1985 | Brunner et al. | 148/16.6 |
| 4,582,679 | 4/1986 | Wilson et al. | 419/13 |
| 4,654,232 | 3/1987 | Sayano | 427/376.6 |
| 4,670,024 | 6/1987 | Bhat et al. | 51/295 |
| 4,707,238 | 11/1987 | Okubo | 204/192.31 |
| 4,781,989 | 11/1988 | Yoshimura et al. | 428/552 |
| 4,800,105 | 1/1989 | Nakayama et al. | 427/253 |
| 4,846,899 | 7/1989 | Wilson | 148/16.6 |
| 4,902,359 | 2/1990 | Takeuchi et al. | 148/133 |
| 4,902,535 | 2/1990 | Garg et al. | 427/292 |

FOREIGN PATENT DOCUMENTS

| | | |
|---|---|---|
| 0075316 | 3/1983 | European Pat. Off. |
| 0268248 | 5/1988 | European Pat. Off. |
| 0291278 | 11/1988 | European Pat. Off. |
| 1408294 | 10/1975 | United Kingdom |
| 2075068 | 11/1981 | United Kingdom |
| 2123039 | 1/1984 | United Kingdom |
| 2135337 | 8/1984 | United Kingdom |

*Primary Examiner*—R. Dean
*Assistant Examiner*—Robert R. Koehler
*Attorney, Agent, or Firm*—MacMillan, Sobanski & Todd

[57] ABSTRACT

An improved hardened insert and brake shoe adapted for use in bi-directional backstopping clutches is disclosed. The inserts are formed from a base material of high speed alloy tool steel, which is relatively inexpensive and easy to machine. The base material is formed into the desired shape for the insert, then hardened and tempered by conventional processes to achieve a desired hardness. Then, a coating of titanium nitride is applied to the insert by a physical vapor deposition process or a chemical vapor deposition process. The titanium nitride coating provides a very hard surface to the insert, which permits the insert to be used in the backstopping clutch. In an alternative embodiment, the brake shoes are formed in the manner described above, and no inserts are used in the clutch.

12 Claims, 2 Drawing Sheets

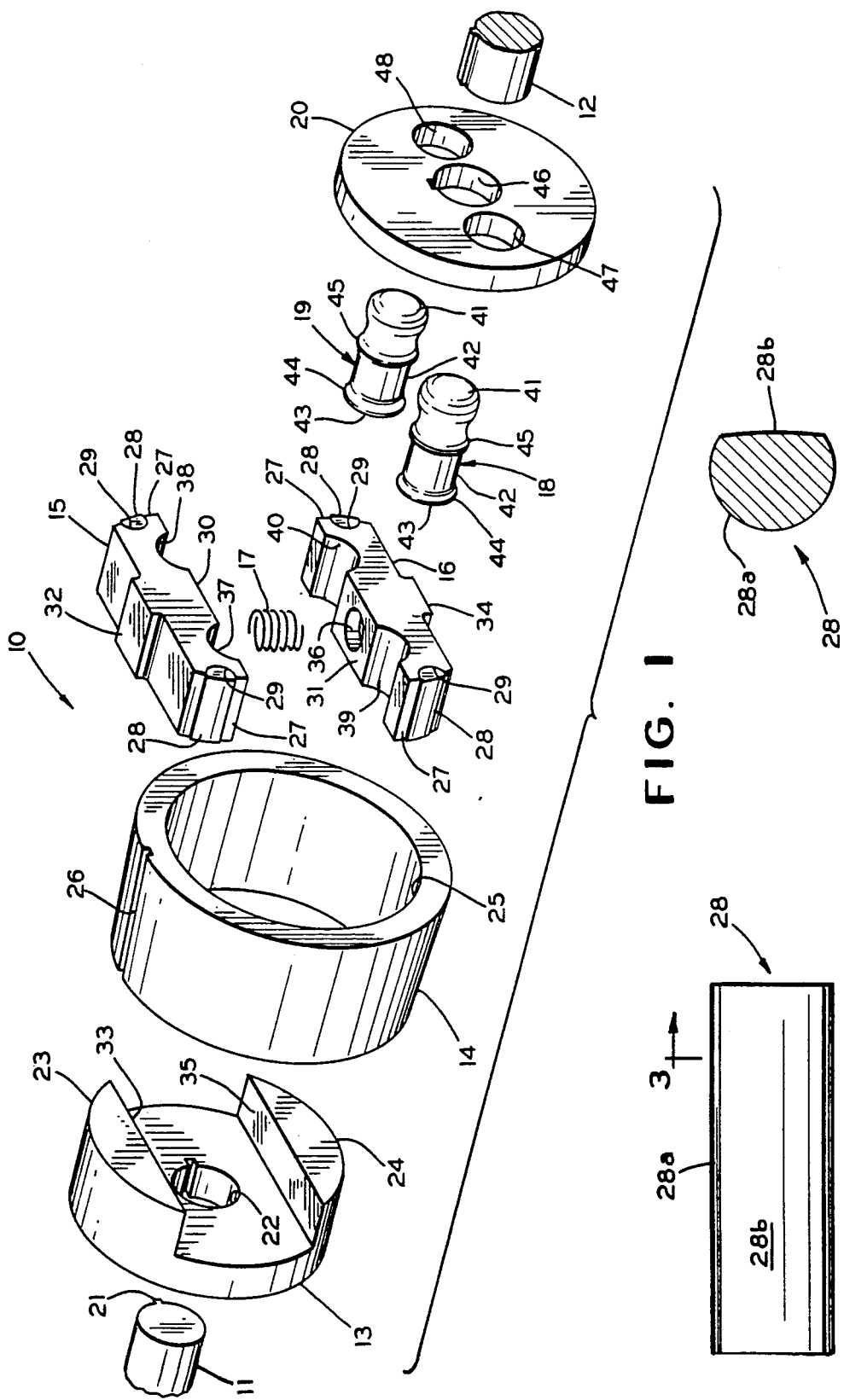
FIG. 1
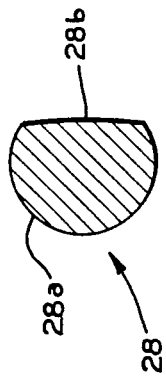
FIG. 3
FIG. 2

HARDENED INSERT AND BRAKE SHOE FOR BACKSTOPPING CLUTCH

CROSS REFERENCE TO RELATED APPLICATION

This application is a continuation-in-part of U.S. Ser. No. 07/517,563, filed Apr. 30, 1990.

BACKGROUND OF THE INVENTION

This invention relates in general to bi-directional backstopping clutches and in particular to an improved hardened insert and brake shoe adapted for use in such clutches.

Bi-directional motors are well known devices which are adapted to selectively rotate an output shaft in either a clockwise or counterclockwise direction. Usually, the output shaft is connected to a driven device for rotation therewith, and rotation of the output shaft transmits torque to the driven device. In certain situations, however, the driven device may tend to back drive torque to the motor. In order to prevent this back driving action, a backstopping clutch is usually coupled between the output shaft of the motor and the input shaft of the driven device. A typical bi-directional backstopping clutch includes an input yoke connected to a pair of opposed brake shoes disposed within a hollow cylindrical brake drum. The brake shoes are generally semi-circular in shape, having arcuate braking surfaces which correspond to the inner surface of the brake drum. A pair of drive pins are disposed between the brake shoes, normally in parallel alignment. The drive pins extend into apertures formed in an output member.

Under normal operating conditions, the input yoke rotates the brake shoes, the drive pins, and the output shaft within the brake drum, thereby transmitting torque through to the driven device. However, if the driven device attempts to back drive torque through the clutch, the output member causes the drive pins to become skewed. As a result, the brake shoes are spread apart from one another into locking frictional engagement with the inner surface of the brake drum. In this manner, the clutch prevents back driving of the motor by the driven device.

The brake shoes are typically provided with hardened wear resistant inserts. The inserts are disposed in respective slots formed in the arcuate outer braking surfaces of the brake shoes. When the brake shoes are moved apart from one another during braking as described above, the inserts frictionally engage the inner surface of the brake drum. The inserts are provided to reduce wear and to reduce repair costs when the braking surfaces have become worn. In the past, these inserts have been formed from solid tungsten carbide Although inserts formed of this material function satisfactorily, they are quite difficult to manufacture. The extreme hardness of the tungsten carbide material makes them very difficult to grind to proper dimensions. Furthermore, because of the nature of the material itself and the difficulties involved in machining such material, tungsten carbide inserts are quite expensive. At the present time, a single insert manufactured from solid tungsten carbide may cost up to twenty dollars. Accordingly, it would be desirable to provide an insert which is formed from a less expensive material and which is easier to machine than tungsten carbide, yet which functions satisfactorily in bi-directional backstopping clutches. Alternatively, it would be desirable to provide a backstopping clutch which does not require the use of any inserts whatsoever.

SUMMARY OF THE INVENTION

This invention relates to an improved hardened insert and brake shoe adapted for use in bi-directional backstopping clutches. The inserts are formed from a base material of high speed alloy tool steel, which is relatively inexpensive and easy to machine. The base material is formed into the desired shape for the insert, then hardened and tempered by conventional processes to achieve a desired hardness. Then, a coating of titanium nitride is applied to the insert by a physical vapor deposition process or a chemical vapor deposition process. The titanium nitride coating provides a very hard surface to the insert, which permits the insert to be used in the backstopping clutch. In an alternative embodiment, the brake shoes are formed in the manner described above, and no inserts are used in the clutch.

It is an object of this invention to provide an improved hardened insert for use with a conventional brake shoe in a bi-directional backstopping clutch.

It is another object of this invention to provide such an insert which is much easier to manufacture and which is substantially less expensive in cost than conventional inserts.

It is a further object of this invention to provide an improved hardened brake shoe for use in a bi-directional backstopping clutch which does not require the use of any inserts.

Other objects and advantages of this invention will become apparent to those skilled in the art from the following detailed description of the preferred embodiments, when read in light of the accompanying drawings.

BRIEF DESCRIPTION OF THE DRAWINGS

FIG. 1 is an exploded perspective view of a bi-directional backstopping clutch including a plurality of improved hardened inserts in accordance with this invention.

FIG. 2 is a plan view of one of the inserts illustrated in FIG. 1.

FIG. 3 is a sectional elevational view taken along line 3—3 of FIG. 2.

DETAILED DESCRIPTION OF THE PREFERRED EMBODIMENTS

Figure 4:
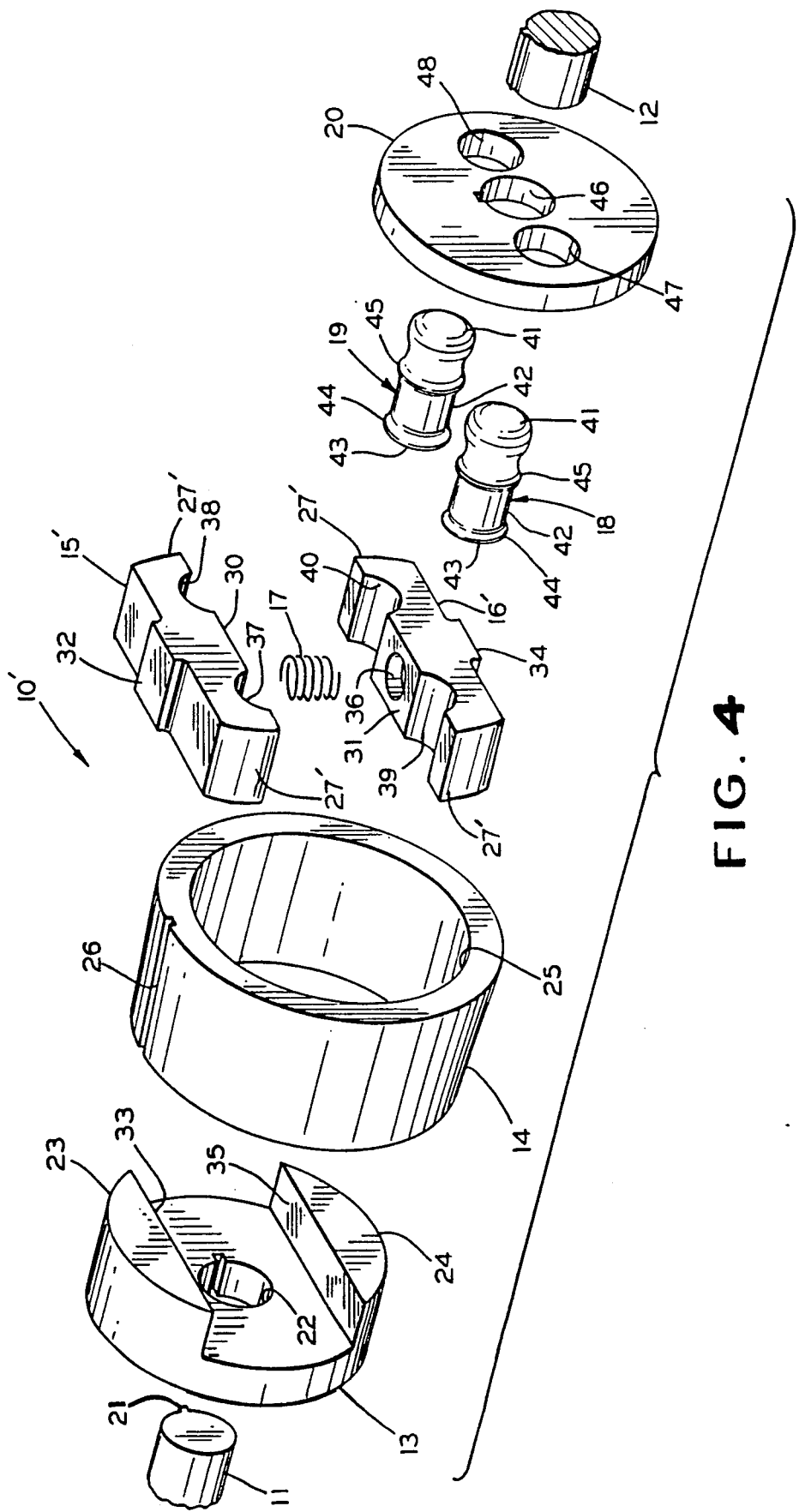
FIG. 4 is an exploded perspective view of a bi-directional backstopping clutch including a pair of improved hardened brake shoes in accordance with this invention.

Referring now to the drawings, there is illustrated in FIG. 1 a bi-directional backstopping clutch, indicated generally at 10. The basic structure and operation of the clutch 10 is described in detail in co-pending and commonly owned application U.S. Ser. No. 07/430,811, the disclosure of which is incorporated herein by reference. The clutch 10 is connected between an input shaft 11 and an output shaft 12. The input shaft 11 has a key 21 formed thereon which cooperates with a complementary shaped opening 22 formed through an input yoke 13. The input yoke 13 includes two spaced axially extending projections 23 and 24. The input yoke 13 is sized such that at least the projections 23 and 24 extend within a central opening 25 formed in a brake drum 14. A key slot 26 or other suitable means is provided on the brake drum 14 for securing it to a support surface (not shown) to prevent rotation.

A pair of brake shoes 15 and 16 are disposed within the brake drum 14. The brake shoes 15 and 16 are formed generally in the shape of semi-circular segments, having arcuate outer surfaces 27. The shoe 15 has an outer flat surface 32 formed thereon which cooperates with a corresponding flat surface 33 formed on the input yoke projection 23. Similarly, the shoe 16 has an outer flat surface 34 formed thereon which cooperates with a corresponding flat surface 35 formed on the input yoke projection 24. The brake shoes 15 and 16 have respective inner flat surfaces 30 and 31 formed thereon which face one another and are slightly spaced apart when the clutch 10 is assembled. A spring 17 is disposed between the two brake shoes 15 and 16 so as to urge them outwardly apart from one another. One end of the spring 17 is located in a recess 36 formed in the center of the inner surface 31, while the other end is located in a similar recess (not shown) formed in the inner surface 30.

Two semi-circular grooves 37 and 38 are formed in the inner surface 30 of the brake shoe 15, while two similar semi-circular grooves 39 and 40 are formed in the inner surface 31 of the brake shoe 16. When the brake shoes 15 and 16 are assembled, the grooves 37 and 39 and the grooves 38 and 40 are respectively aligned to define two cylindrical openings between the shoes 15 and 16. A pair of output pins 18 and 19 are disposed within the openings. Each of the pins 18 and 19 includes a shank 42 having a first end 41 and a second end 43. A first enlarged diameter annular ridge 45 is formed about the shank 42 near the center thereof, while a second enlarged diameter annular ridge 44 is formed about the shank 42 adjacent the second end 43. The annular ridges 44 and 45 sized and spaced apart from one another so as to be disposed within the cylindrical openings defined between the brake shoes 15 and 16 when the clutch 10 is assembled.

An output member 20 is provided with a keyed central opening 46 for connection to the output shaft 12. A pair of openings 47 and 48 are also formed through the output member 20. The openings 47 and 48 are aligned with the output pins 18 and 19 such that the heads 41 thereof are received therein. The cooperation of the output pins 18 and 19 with the output member 20 provides the desired backstopping action for the clutch 10.

The outer surfaces of the brake shoes 15 and 16 are formed having relatively small semi-cylindrical recesses, as shown at 29. Within each of the recesses 29, an insert 28 is disposed. The structure of one of the inserts 28 is illustrated more clearly in FIGS. 2 and 3. As shown therein, the insert 28 is semi-cylindrical in shape, having a curved surface 28a and a slightly curved surface 28b. During use, when the inserts 28 are installed on the brake shoes 15 and 16, they rotate within the recesses 29 so that the slightly curved surfaces 28b frictionally engage the inner surface of the brake drum 14 when the brake shoes 15 and 16 are moved apart during the backstopping action of the clutch 10. This movement insures uniform loading of the engaging surfaces of the inserts 28 and the brake drum 14. As a result, the performance characteristics of the clutch 10, such as input lash, output lash, and efficiency, are less susceptible to deterioration from wear of the contacting surfaces. Also, the inserts 28 are easily replaceable when excessive wear does occur.

The novelty of this invention resides in the composition of the inserts 28. Each insert 28 is formed from a base material of a high speed alloy tool steel, such as M2 steel. This, or a similar material, is used because it has a relatively high annealling temperature, as will be further explained below. For example, the annealling temperature of M2 steel is approximately 1000° F. The base material is initially formed into the desired configuration for the insert 28 by any conventional means. Typically, an elongated strip of material is drawn having the desired cross sectional shape for the inserts 28. The strip is then cut into short lengths to form the inserts 28. Next, the cut inserts 28 are hardened and tempered by any conventional process. As a result of such process, the inserts 28 are preferably hardened to within the range of approximately sixty-two to sixty-five on the Rockwell C scale.

Lastly, the hardened inserts 28 are coated with a thin layer of titanium nitride. The titanium nitride coating may be applied by any conventional process, such as physical vapor deposition or chemical vapor deposition. The thickness of the coating is preferably in the range of from 0.0001 inch to 0.0002 inch on all of the surfaces of the insert 28 so as to provide a surface hardness of approximately eighty-five on the Rockwell C scale. Typically, the titanium nitride coating is applied at an elevated temperature, usually about 450° F. Thus, it is preferable that the annealling temperature of the base material be somewhat higher than this temperature, so as to prevent the base material from being softened during the application of the titanium nitride coating.

The resultant insert 28 is much easier to manufacture and significantly less expensive than the prior inserts formed of solid tungsten carbide discussed above. It is estimated that one insert 28 formed from the titanium nitride coated steel costs approximately four to five dollars, as opposed to the approximate twenty dollar cost for one of the prior solid tungsten carbide inserts. Not only have the titanium nitride coated steel inserts 28 been found to function satisfactorily in clutches 10, two important advantages have been noted. First, the titanium nitride coating appears to have a dry lubricant property which reduces friction (and consequent wear) when the clutch is operating normally, i.e, not in a backstopping mode. Thus, maintenance for the clutch 10 is required less frequently. Second, the use of the softer base material in combination with the titanium nitride coating appears to permit the clutch 10 to rotate at somewhat higher speeds without undesirable chattering. As a result, the clutch 10 may be used in higher speed applications than previously believed acceptable.

Referring now to FIG. 4, there is illustrated an exploded perspective view of an alternative embodiment of a bi-directional backstopping clutch 10' in accordance with this invention. The structure of the clutch 10' is quite similar to the clutch 10 described above, and like reference numbers have been used to indicated identical parts. The clutch 10' includes a pair of improved hardened brake shoes 15' and 16' disposed within the brake drum 14. The brake shoes 15' and 16' are formed generally in the shape of semi-circular segments, having arcuate outer surfaces 27'. The arcuate outer surfaces 27' are shaped generally to conform to the arcuate inner surface 25 of brake drum 14. No grooves or inserts are provided in the surfaces 27', as in the arcuate surfaces 27 of the brake shoes 15 and 16 illustrated in FIGS. 1 through 3.

Each of the brake shoes 15' and 16' can be formed from the same material and in the same manner as the inserts 28 discussed above. Thus, the brake shoes 15' and 16' are formed from a base material of a high speed alloy tool steel, such as M2 steel, and coated with a layer of titanium nitride. The arcuate outer surfaces 27' of the brake shoes 15' and 16' directly engage the arcuate inner surface 25 of the brake drum 14 during use.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. A method for forming a brake shoe adapted for use in an overrunning clutch comprising the steps of:
    (a) forming a base material which is softer than tungsten carbide into a desired configuration for the brake shoe;
    (b) hardening the formed base material to a desired hardness;
    (c) coating the hardened base material with a layer of titanium nitride; and
    (d) installing the brake shoe in an overrunning clutch.

2. The invention defined in claim 1 wherein said base material is selected to have relatively high annealling temperature.

3. The invention defined in claim 1 wherein said step (c) is performed by a physical vapor deposition process.

4. The invention defined in claim 1 wherein said step (c) is performed by a chemical vapor deposition process.

5. The invention defined in claim 1 wherein the thickness of the coating is in the range of from 0.0001 inch to 0.0002 inch.

6. A method for forming a brake shoe adapted for use in an overrunning clutch comprising the steps of:
    (a) forming a base material which is softer than tungsten carbide into a desired configuration for the brake shoe;
    (b) hardening the formed base material to within the range of approximately sixty-two to sixty-five on the Rockwell C scale;
    (c) coating the hardened base material with a layer of titanium nitride to provide a surface hardness of approximately eighty-five on the Rockwell C scale; and
    (d) installing the brake shoe in an overrunning clutch.

7. The invention defined in claim 6 wherein said base material is selected to have relatively high annealling temperature.

8. The invention defined in claim 6 wherein said step (c) is performed by a physical vapor deposition process.

9. The invention defined in claim 6 wherein said step (c) is performed by a chemical vapor deposition process.

10. The invention defined in claim 6 wherein the thickness of the coating is in the range of from 0.0001 inch to 0.0002 inch.

11. An overrunning clutch comprising:
    a hollow brake drum having a cylindrical inner surface;
    a pair of opposed brake shoes disposed within said brake drum, said brake shoes including recesses formed therein which define at least one opening therebetween, each of said brake shoes being formed from a base material having a hardness within the range of approximately sixty-two to sixty-five on the Rockwell C scale and a layer of titanium nitride coating the hardened base material so as to provide a surface hardness of approximately eighty-five on the Rockwell C scale;
    an input member engaged with said brake shoes for rotating said brake shoes within said brake drum;
    an output member having at least one opening formed therein; and
    an output pin having a head portion disposed within said output member opening and a shank portion disposed within said brake shoe opening, said pin skewing in response to a predetermined back driving torque on said output member to move said brake shoes into contact with said brake drum to prevent rotation.

12. The invention defined in claim 11, wherein the thickness of said layer of titanium nitride is in the range of from 0.0001 inch to 0.0002 inch.

* * * * *